United States Patent
Lin et al.

(10) Patent No.: US 9,947,398 B1
(45) Date of Patent: Apr. 17, 2018

(54) SEMICONDUCTOR MEMORY DEVICE AND OPERATION METHOD THEREOF

(71) Applicant: MACRONIX INTERNATIONAL CO., LTD., Hsinchu (TW)

(72) Inventors: Yu-Hsuan Lin, Taichung (TW); Kai-Chieh Hsu, Taoyuan (TW); Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/482,978

(22) Filed: Apr. 10, 2017

Related U.S. Application Data

(60) Provisional application No. 62/448,399, filed on Jan. 20, 2017.

(51) Int. Cl.
  G11C 11/00 (2006.01)
  G11C 13/00 (2006.01)
  G06F 1/32 (2006.01)

(52) U.S. Cl.
  CPC ........ G11C 13/0038 (2013.01); G06F 1/3296 (2013.01); G11C 13/004 (2013.01); G11C 13/0026 (2013.01)

(58) Field of Classification Search
  CPC ............ G11C 13/0038; G11C 13/0026; G11C 13/004; G06F 1/3296
  USPC ....... 365/148, 46, 55, 74, 97, 100, 131, 158, 365/171, 173, 163
  See application file for complete search history.

(56) References Cited

U.S. PATENT DOCUMENTS

| | | | |
|---|---|---|---|
| 2007/0140029 A1* | 6/2007 | Kim | G11C 7/062 365/233.12 |
| 2012/0147664 A1 | 6/2012 | Rho | |
| 2014/0185361 A1 | 7/2014 | Oh et al. | |
| 2014/0281279 A1 | 9/2014 | Oh et al. | |
| 2016/0019943 A1 | 1/2016 | Chih et al. | |
| 2017/0243622 A1* | 8/2017 | Sandhu | G11C 7/062 |

* cited by examiner

*Primary Examiner* — Fernando Hidalgo
(74) *Attorney, Agent, or Firm* — McClure, Qualey & Rodack, LLP

(57) ABSTRACT

A semiconductor memory device includes: a memory array including a plurality of memory cells, the memory cells being in any of a high resistance state (HRS) and a low resistance state (LRS); a reference array including a plurality of reference cells, the memory cells and the reference cells having the same impedance-temperature relationship, the reference cells being in a middle resistance state between HRS and LRS; an average circuit configured for averaging respective reference currents from the reference cells of the reference array into an average reference current; and a comparator configured for comparing a plurality of respective memory currents from the memory cells of the memory array with the average reference current to obtain a plurality of output data of the memory cells of the memory array and to determine respective impedance states of the memory cells of the memory array.

10 Claims, 1 Drawing Sheet

SEMICONDUCTOR MEMORY DEVICE AND OPERATION METHOD THEREOF

CROSS-REFERENCE TO RELATED ART

This application claims the benefit of U.S. Patent Provisional application Ser. No. 62/448,399, filed on Jan. 20, 2017, the disclosure of which is incorporated by reference herein in its entirety.

TECHNICAL FIELD

The disclosure relates in general to a semiconductor memory device and an operation method thereof.

BACKGROUND

Many companies develop Resistive random-access memory (ReRAM) because ReRAM has advantages of low power consumption and high access speed.

Impedance of ReRAM is temperature dependent. Thus, if temperature varies, the impedance of ReRAM also varies. Usually, a resistor having constant resistance is used to generate the constant reference current. When temperature varies, the current output from ReRAM also varies. Thus, it is not easy to correctly determine whether ReRAM is in the high resistance state (HRS) or in the low resistance state (LRS). That is, it is not easy to determine whether data stored in ReRAM is logic 1 or logic 0.

Therefore, it is desirable to generate the reference current having temperature dependent. Even when temperature is varied in a wide range, it is easy to correctly determine whether ReRAM is in HRS or in LRS and to correctly determine data stored in ReRAM.

SUMMARY

According to one embodiment, provided is a semiconductor memory device including: a memory array including a plurality of memory cells, the memory cells being in any of a high resistance state (HRS) and a low resistance state (LRS); a reference array including a plurality of reference cells, the memory cells and the reference cells having the same impedance-temperature relationship, the reference cells being in a middle resistance state between the high resistance state (HRS) and the low resistance state (LRS); an average circuit, coupled to the reference array, being configured for averaging respective reference currents from the reference cells of the reference array into an average reference current; and a comparator coupled to the reference array and the average circuit, being configured for comparing a plurality of respective memory currents from the memory cells of the memory array with the average reference current to obtain a plurality of output data of the memory cells of the memory array and to determine respective impedance states of the memory cells of the memory array.

According to another embodiment, provided is an operation method for a semiconductor memory device. The operation method includes: outputting a plurality of respective memory currents from a plurality of memory cells of a memory array and outputting a plurality of references currents from a plurality of reference cells of a reference array; averaging the respective reference currents from the reference cells of the reference array into an average reference current; and comparing the average reference current and the respective memory currents from the memory cells of the memory array, respectively, to obtain a plurality of output data of the memory cells of the memory array and to determine respective impedance states of the memory cells of the memory array. The memory cells of the memory array are in any of a high resistance state (HRS) and a low resistance state (LRS). The memory cells of the memory array and the reference cells of the reference array have the same impedance-temperature relationship. The reference cells of the reference array are in a middle resistance state between the high resistance state (HRS) and the low resistance state (LRS).

Figure 1:
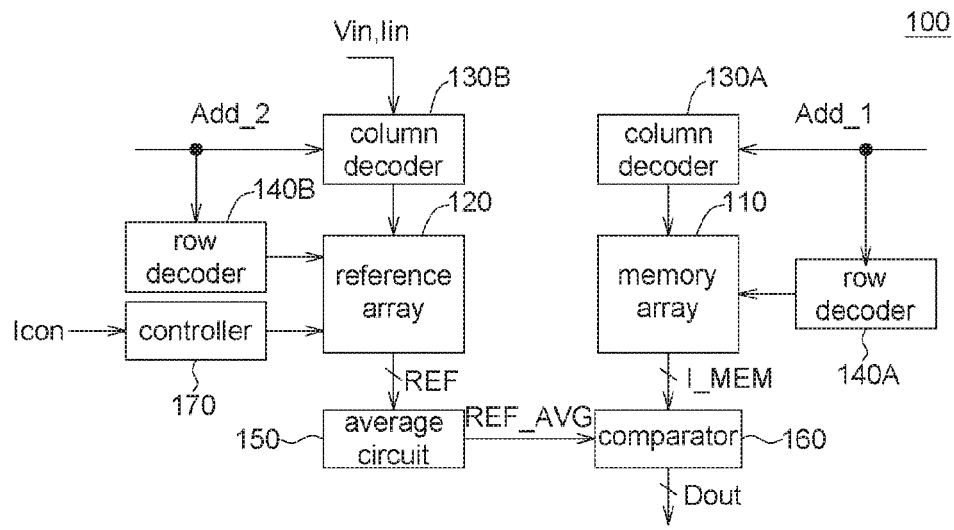
FIG. 1 shows a functional block diagram of a semiconductor memory device according to an embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

In an embodiment of the application, ReRAM cells may be used as the reference cells. A plurality of reference currents output from a plurality of ReRAM reference cells are calculated (for example but not limited by, averaged) into an average reference current. The average reference current will be varied with the temperature. Thus, in the embodiment of the application, even when the temperature varies, it is easy to determine whether the ReRAM is in the high resistance state or in the low resistance state because the average reference current will be varied with the temperature.

FIG. 1 shows a functional block diagram of a semiconductor memory device 100 according to an embodiment of the application. The semiconductor memory device 100 includes a memory array 110, a reference array 120, column decoders 130A and 130B, row decoders 140A and 140B, an average circuit 150, a comparator 160 and a controller 170.

The memory array 110 includes a plurality of memory cells arranged in an array. The memory array 110 is coupled to the column decoder 130A, the row decoder 140A and the comparator 160. The memory cells of the memory array 110 are in any of the high resistance state (HRS) or the low resistance state (LRS).

The reference array 120 includes a plurality of reference cells arranged in an array. The reference array 120 is coupled to the column decoder 130B, the row decoder 140B and the average circuit 150. In the embodiment of the application, the memory cells of the memory array 110 and the reference cells of the reference array 120 both use the same type of semiconductor cells. In here, the memory cells and the reference cells are both implemented by the ReRAM cells as an example, but the application is not limited by. In other possible embodiments of the application, the memory states of the memory cells and the reference cells will be varied with the temperature (that is, the memory elements of the memory cells and the reference cells have temperature-dependent impedance states and/or memory states), which is still within the spirit and the scope of the application. Further, the memory cells and the reference cells have the same circuit configuration and operations.

The column decoder 130A and the row decoder 140A decode the memory address Add_1 to address the memory cells of the memory array 110. The circuit configuration and the operations of the column decoder 130A and the row decoder 140A are not specified here.

Similarly, the column decoder 130B and the row decoder 140B decode the reference address Add_1 to address the reference cells of the reference array 120. The circuit configuration and the operations of the column decoder 130B and the row decoder 140B are not specified here.

The average circuit 150 is for averaging a plurality of respective reference currents REF from the reference cells of the reference array 120 into an average reference current REF_AVG, wherein the current from the reference cell is referred as the reference current. In the embodiment of the application, because the memory cells and the reference cells are both implemented by the ReRAM cells, the memory states of the memory cells and the reference cells are varied with the temperature, the reference currents REF from the reference cells are varied with the temperature and also the average reference current REF_AVG is varied with the temperature.

The comparator 160 compares the average reference current REF_AVG with the respective memory currents I_MEM from the memory cells of the memory array 110, respectively, to obtain the output data Dout and to determine the respective memory states of the memory cells of the memory array 110. The circuit configuration and the operations of the comparator 160 are not specified here.

The controller 170 is coupled to the reference array 120. The controller 170 is configured for controlling the reference array 120 for generating the desired reference currents REF and the average reference current REF_AVG.

In order to generate the desired reference currents REF and the average reference current REF_AVG, in the embodiment of the application, after the semiconductor memory device 100 is manufactured and tested, before shipping, the controller 170 may control and/or adjust the operation voltage Vin and/or the operation current Iin applied to the reference array 120, to adjust the reference currents REF from the reference cells of the reference array 120 and to adjust the average reference current REF_AVG, until the average reference current REF_AVG reaches the target current Icon (which is constant and may be generated by a current generator). In this situation (the average reference current REF_AVG reaches the target current Icon), the reference currents REF generated from the reference cells are basically close to each other. In other words, the reference currents REF generated from the reference cells may be not the same exactly, but the difference between the reference currents REF generated from the reference cells is not large.

Because the operation voltage Vin and/or the operation current Iin applied to the reference array 120 may be controlled and/or adjusted, the respective impedance states (i.e. the memory states) of the reference cells of the reference array 120 may be changed, for example, from the high resistance state into the middle resistance state, or from the low resistance state into the middle resistance state. When the average reference current REF_AVG reaches the target current Icon, in fact, all reference cells of the reference array 120 will be in the middle resistance state. That is, in the initial setting before shipping, all reference cells of the reference array 120 will be in the middle resistance state, wherein the middle resistance state is between the high resistance state and the low resistance state. In other words, in the embodiment of the application, when the semiconductor memory device 100 is accessed, all reference cells of the reference array 120 will be in the middle resistance state.

Further, in the embodiment of the application, if the number of the reference cells is suitable, the reference currents from the reference cells have small variation and thus the variation of the average reference current is also small.

Of course, the functional blocks of the semiconductor memory device 100 in FIG. 1 is simplified for explanation. One skilled person in the art would understand that the semiconductor memory device 100 of the embodiment of the application may include other elements.

Figure 2:
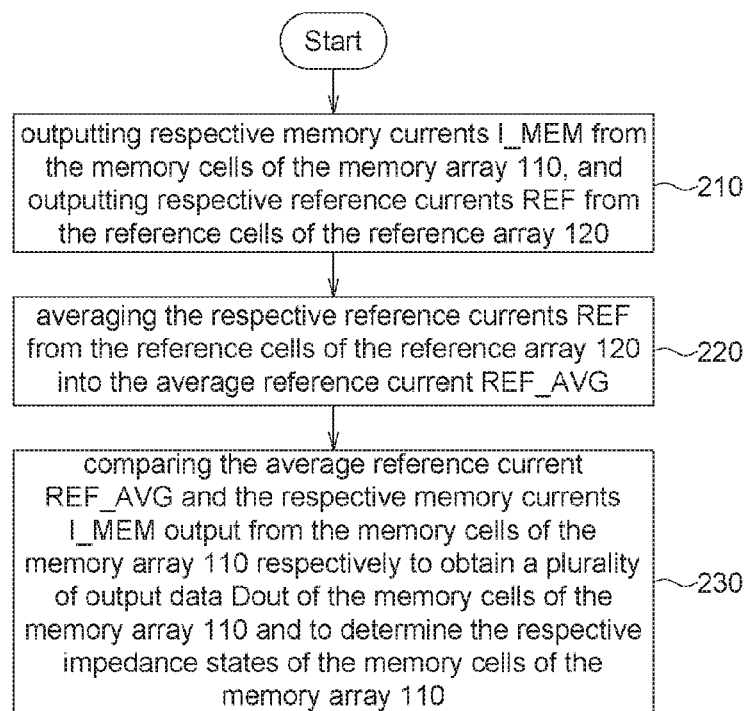
FIG. 2 shows an operation method for the semiconductor memory device according to an embodiment of the application.

FIG. 2 shows an operation method for the semiconductor memory device according to an embodiment of the application. In step 210, the memory cells of the memory array 110 output respective memory currents I_MEM, and the reference cells of the reference array 120 output respective reference currents REF.

In step 220, the respective reference currents REF from the reference cells of the reference array 120 are averaged into the average reference current REF_AVG.

In step 230, the average reference current REF_AVG and the respective memory currents I_MEM output from the memory cells of the memory array 110 are compared respectively to obtain a plurality of output data Dout of the memory cells of the memory array 110 and to determine the respective impedance states of the memory cells of the memory array 110.

In the current technology, the reference current is fixed and constant. When the temperature varies, the output memory currents from the ReRAM cells are also varied. Thus, it is not easy to correctly determine data stored in the ReRAM cells.

On the contrary, in the embodiment of the application, the reference array including ReRAM reference cells is configured for generating a plurality of reference currents and the reference currents are averaged into the average reference current. When the temperature varies, although the memory currents from the memory array (including ReRAM memory cells) are varied with the temperature, the average reference current is also varied with the varying temperature. Because the memory currents from the ReRAM memory cells of the memory array have the same temperature trend as the reference currents from the ReRAM reference cells of the reference array (i.e. the ReRAM memory cells of the memory array have the same impedance-temperature trend as the ReRAM reference cells of the reference array), in the embodiment of the application, even if the temperature is varied in a wide range, it is also easy to correctly determine data stored in the ReRAM memory cells.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor memory device including:
   a memory array including a plurality of memory cells, in the setting, the memory cells being in any of a high resistance state (HRS) and a low resistance state (LRS);
   a reference array including a plurality of reference cells, the memory cells and the reference cells having the same impedance-temperature relationship, the reference cells being programmed in a middle resistance state between the high resistance state (HRS) and the low resistance state (LRS) in initial setting;
   an average circuit, coupled to the reference array, being configured for averaging respective reference currents from the reference cells of the reference array into an average reference current; and
   a comparator coupled to the reference array and the average circuit, being configured for comparing a plurality of respective memory currents from the memory cells of the memory array with the average reference current to obtain a plurality of output data of the memory cells of the memory array and to determine respective impedance states of the memory cells of the memory array.

2. The semiconductor memory device according to claim 1, wherein the memory cells of the memory array and the reference cells of the reference array have the same circuit configuration.

3. The semiconductor memory device according to claim 1, wherein the memory cells of the memory array and the reference cells of the reference array include a plurality of ReRAM (Resistive random-access memory) cells.

4. The semiconductor memory device according to claim 1, wherein
   the memory cells of the memory array and the reference cells of the reference array have temperature-dependent memory states;
   the reference currents from the reference cells are temperature-dependent; and
   the average reference current is temperature-dependent.

5. The semiconductor memory device according to claim 1, further comprising a controller coupled to the reference array, being configured for controlling the reference array to generate the reference currents and the average reference current.

6. The semiconductor memory device according to claim 5, wherein the controller controls and/or adjusts an operation voltage and/or an operation current applied to the reference array to adjust the reference currents from the reference cells of the reference array and to adjust the average reference current until the average reference current reaches a constant target current.

7. The semiconductor memory device according to claim 6, wherein the controller controls and/or adjusts the operation voltage and/or the operation current applied to the reference array and accordingly, respective impedance states of the reference cells of the reference array are programmed in the middle resistance state in initial setting.

8. An operation method for a semiconductor memory device, the operation method including:
   outputting a plurality of respective memory currents from a plurality of memory cells of a memory array and outputting a plurality of references currents from a plurality of reference cells of a reference array;
   averaging the respective reference currents from the reference cells of the reference array into an average reference current; and
   comparing the average reference current and the respective memory currents from the memory cells of the memory array, respectively, to obtain a plurality of output data of the memory cells of the memory array and to determine respective impedance states of the memory cells of the memory array,
   wherein the memory cells of the memory array are in any of a high resistance state (HRS) and a low resistance state (LRS),
   the memory cells of the memory array and the reference cells of the reference array have the same impedance-temperature relationship, and
   the reference cells of the reference array are programmed in a middle resistance state between the high resistance state (HRS) and the low resistance state (LRS) in initial setting.

9. The operation method for the semiconductor memory device according to claim 8, further including:
   controlling and/or adjusting an operation voltage and/or an operation current applied to the reference array to adjust the reference currents from the reference cells of the reference array and to adjust the average reference current until the average reference current reaches a constant target current.

10. The operation method for the semiconductor memory device according to claim 9, further including:
    controlling and/or adjusting the operation voltage and/or the operation current applied to the reference array and accordingly, respective impedance states of the reference cells of the reference array are programmed in the middle resistance state in initial setting.

* * * * *